(12) United States Patent
Goh et al.

(10) Patent No.: US 10,962,592 B2
(45) Date of Patent: Mar. 30, 2021

(54) DEFECT LOCALIZATION IN EMBEDDED MEMORY

(71) Applicant: GLOBALFOUNDRIES Singapore Pte. Ltd., Singapore (SG)

(72) Inventors: Szu Huat (Wu Shifa) Goh, Singapore (SG); Yin Hong Chan, Singapore (SG); Boon Lian Yeoh, Johor Bahru (SG); Lin Zhao, Singapore (SG); Man Hon Thor, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 235 days.

(21) Appl. No.: 16/125,162

(22) Filed: Sep. 7, 2018

(65) Prior Publication Data

US 2020/0081061 A1    Mar. 12, 2020

(51) Int. Cl.
*G01R 31/307* (2006.01)
*G01R 31/311* (2006.01)
*G01R 31/28* (2006.01)

(52) U.S. Cl.
CPC ........ *G01R 31/311* (2013.01); *G01R 31/2834* (2013.01)

(58) Field of Classification Search
CPC .. G01R 31/307; G01R 31/308; G01R 31/311; G01R 31/2834; G11C 29/56016;
(Continued)

(56) References Cited

U.S. PATENT DOCUMENTS

| 5,430,305 A | * | 7/1995 | Cole, Jr. | G01R 31/311 250/559.07 |
| 5,493,236 A | * | 2/1996 | Ishii | G01R 31/2656 324/501 |

(Continued)

FOREIGN PATENT DOCUMENTS

| CN | 102323538 A | 1/2012 |
| TW | 200533942 A | 10/2005 |
| TW | 201447335 A | 12/2014 |

OTHER PUBLICATIONS

Rowlette et al., "Critical Timing Analysis in Microprocessors Using Near-IR Laser Assisted Device Alteration (LADA)", ITC International Test Conference, Jan. 2003, vol. 1, IEEE, pp. 264-273.

(Continued)

*Primary Examiner* — Minh N Tang
(74) *Attorney, Agent, or Firm* — Ditthavong, Steiner & Mlotkowski

(57) ABSTRACT

A system and method for defect localization in embedded memory are provided. Embodiments include a system including automated testing equipment (ATE) interfaced with a wafer probe including a diagnostic laser for stimulating a DUT with the diagnostic laser at a ROI. The ATE is configured to simultaneously perform a test run at a test location of the DUT with a test pattern during stimulation of the DUT. Failing compare vectors of a reference failure log of a defective device are stored. A first profile module is configured to generate a first 3D profile from each pixel of a reference image of the defective device. A second profile module is configured to generate a second 3D profile from each pixel of the ROI of the DUT. A cross-correlation module is configured to execute a pixel-by-pixel cross-correlation from the first and second 3D profiles and generate an intensity map corresponding to a level of correlation between the DUT and defective device.

18 Claims, 6 Drawing Sheets

(58) Field of Classification Search
CPC ......... G11C 29/56008; G11C 29/56004; H01J 37/28; H01J 37/256; H01J 37/285; G01B 15/00
See application file for complete search history.

(56) References Cited

U.S. PATENT DOCUMENTS

| | | | |
|---|---|---|---|
| 6,308,290 | B1 | 10/2001 | Forlenza et al. |
| 6,549,022 | B1 | 4/2003 | Cole, Jr. et al. |
| 7,872,489 | B2 | 1/2011 | Dickson et al. |
| 9,739,831 | B2 | 8/2017 | Goh et al. |
| 10,352,995 | B1 * | 7/2019 | Erington ............... G01B 11/272 |
| 2009/0271675 | A1 | 10/2009 | Dickson et al. |
| 2016/0004785 | A1 | 1/2016 | Peters et al. |
| 2016/0047858 | A1 | 2/2016 | Goh et al. |
| 2016/0161556 | A1 | 6/2016 | Goh et al. |

OTHER PUBLICATIONS

Bruce et al., "Soft Defect Localization (SDL) on ICs", Proceedings of the 28th International Symposium for Testing and Failure Analysis (ASM International), Oct. 2002, ISTFA, pp. 21-27.

* cited by examiner

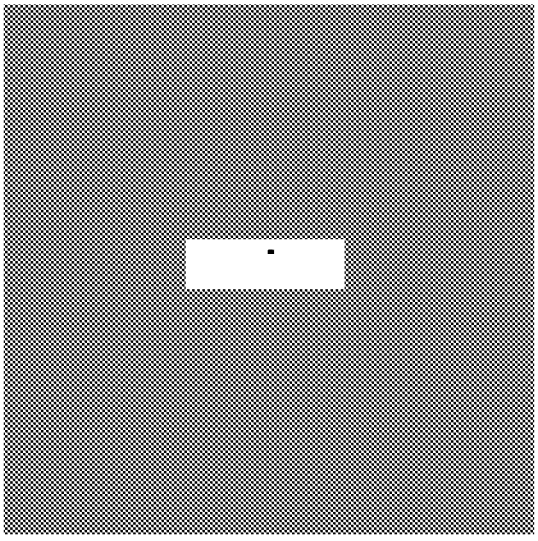
FIG. 6B
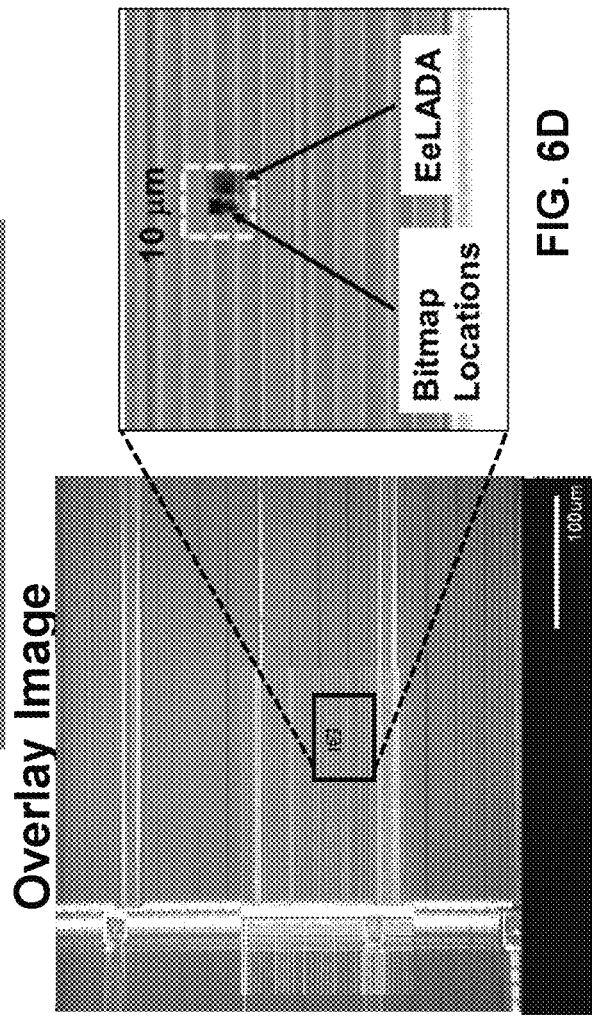
FIG. 6D
FIG. 6C
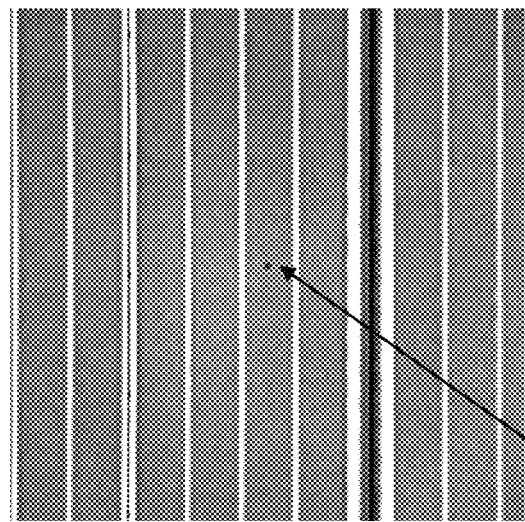
FIG. 6A

DEFECT LOCALIZATION IN EMBEDDED MEMORY

TECHNICAL FIELD

The present disclosure relates to localization of defects in semiconductor devices. The present disclosure is particularly applicable to a system and related method for defect localization in embedded memory.

BACKGROUND

In failure localization of semiconductor devices, bitmapping is an efficient method to isolate embedded memory defects. However, the process of enabling bitmapping is time consuming and resource consuming. Bitmapping is available on high volume products where return on investment is high. Moreover, memory failure defect localization without the use of bitmapping suffers low success rate using conventional static failure analysis approaches Electrically-enhanced laser-assisted device alteration (EeLADA) is a feasible alternative method. However, the current state-of-art in failing bit-cell isolation is inconsistent and limited to a few tens of microns which is not desirable for subsequent physical failure analysis to reveal the defect.

A need therefore exists for a system and method for improved defect localization with EeLADA for isolating bit-cell defects.

SUMMARY

An aspect of the present disclosure is a system for defect localization of embedded memories using enhanced EeLADA at bit-cell resolution. The present system provides improved diagnostic resolution on the failing bit-cell.

Another aspect of the present disclosure is a method of defect localization of embedded memories using enhanced EeLADA at bit-cell resolution.

According to the present disclosure, some technical effects may be achieved in part by a system including automated testing equipment (ATE) interfaced with a wafer probe including a diagnostic laser for stimulating a device under test (DUT) with the diagnostic laser at a region of interest (ROI). The ATE is configured to simultaneously perform a test run at a test location of the DUT with a test pattern during stimulation of the DUT. Storage includes failing compare vectors of a reference failure log of a defective device. A first profile module is configured to generate a first three-dimensional (3D) profile from each pixel of a reference image of the defective device. A second profile module is configured to generate a second 3D profile from each pixel of the ROI of the DUT. A cross-correlation module is configured to execute a pixel-by-pixel cross-correlation from the first and second 3D profiles and generate a technical signal image corresponding to a level of correlation between the DUT and defective device.

Another aspect of the present disclosure is a method including generating a log file comprising fail pins and cycles based upon test vectors on a defective device. A 3D profile of a reference image is generated based upon the log file of the defective device. A DUT is stimulated with a laser from a wafer probe. A log file corresponding to each pixel in a region of interest of the DUT is simultaneously generated. A 3D-profile from each pixel of the region of interest of an image of DUT is generated. A pixel-by-pixel cross-correlation is performed to generate an intensity map that corresponds to a level of correlation between the defective device and DUT.

A further aspect of the present disclosure is a method including simultaneously testing a DUT by stimulating the DUT with a laser at a ROI and performing a test run of the DUT with a test pattern. A 3D-profile is generated from each pixel of the ROI. A pixel-by-pixel cross-correlation is performed to generate an intensity map that corresponds to a level of correlation between the DUT and a prior reference failure log.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 6A, 6B, 6C and 6D are images demonstrating defect isolation of a programmed defect on a DUT.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of localization of memory failure at bit-cell resolution using EeLADA. The problem is solved, inter alia, by improved EeLADA techniques to detect memory failures on a bit-cell resolution. The system and method include scanning of a laser and a performing test run of a DUT simultaneously. The test response from the stimulated test response is profiled as a 3D profile including test pins and cycles and occurrence. Each pixel of the stimulated test response is also profiled. A pixel-by pixel cross-correlation is performed to identify defects in the DUT. Additional comparisons to unmatched fail cycles are performed to further enhance the precision defect localization.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
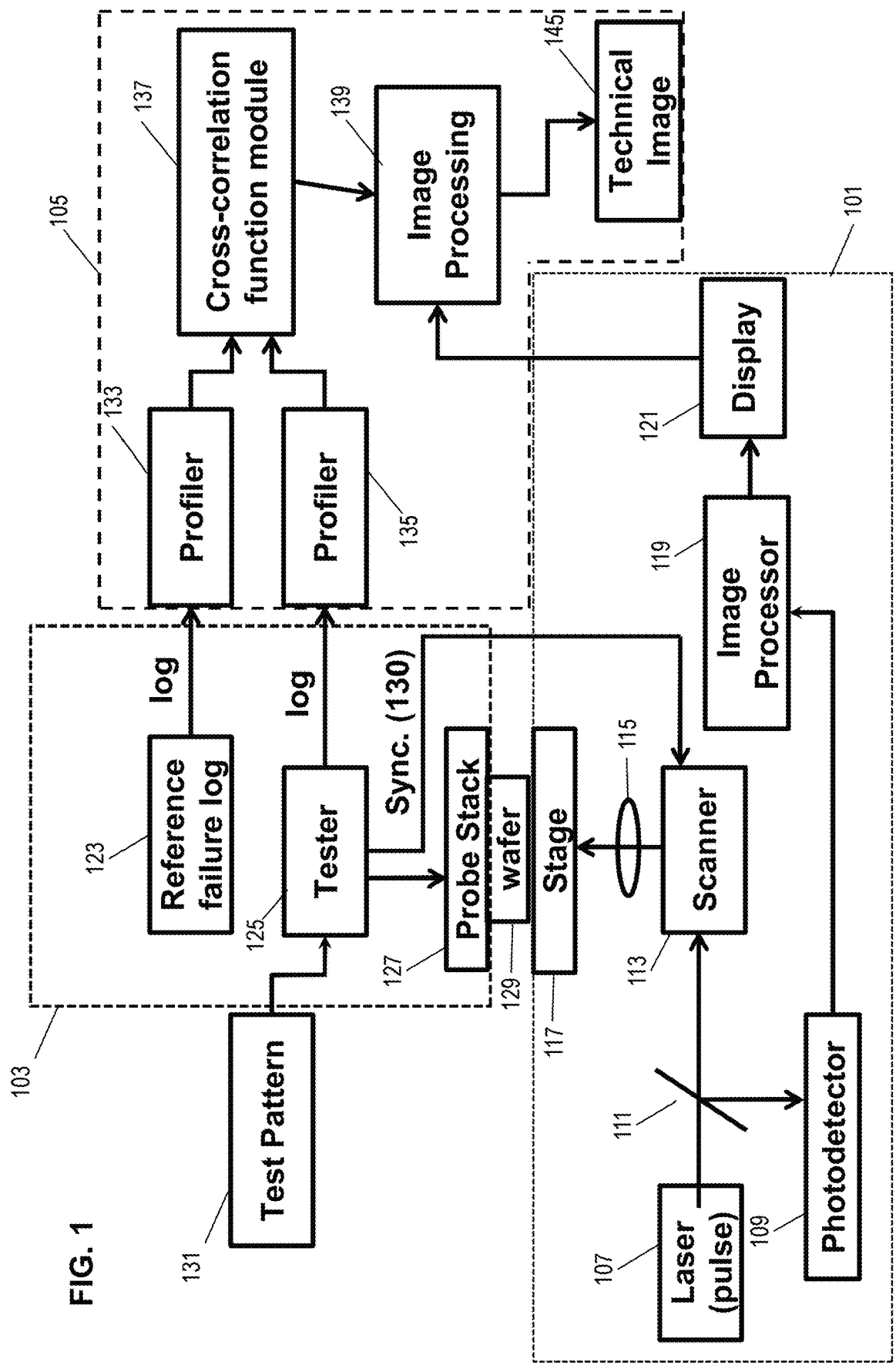
FIG. 1 illustrates a block diagram of a test system for defect localization using EeLADA, in accordance with an exemplary embodiment.

FIG. 1 illustrates a block diagram of a test system for defect localization using EeLADA, in accordance with an exemplary embodiment. The test system facilitates defect isolation in devices. Defect localization is performed in devices such as semiconductor devices or integrated circuits (ICs). Embodiments include testing or analyzing devices or ICs in the manufacturing process to localize defects. Defect localization is facilitated by an EeLADA analysis system. The ICs tested can be any type of IC, such as dynamic or static random access memories, signal processors, microcontrollers or system-on-chip (SoC) devices. Other types of devices may also be useful. The test system of FIG. 1 includes a scanning microscope module 101, a test module 103, and an analysis module 105. The test system may optionally be provided with other modules.

In FIG. 1, the scanning microscope module 101 includes a laser source 107, a photodetector unit 109, a beam splitter 111, a scanner unit 113, a focusing unit 115, a test stage 117, an image processor 119 and a display 121. The scanning microscope, for example, may be a commercially available laser scanning microscope. Such types of scanning microscopes may be from, for example, Thermofisher Scientific, Hamamatsu Photonics, Semicaps and Checkpoint Technologies.

The test module 103 in FIG. 1 includes a reference failure log 123, a test unit 125, and a probe stack 127. The test module includes, for example, commercially available automated testing equipment (ATE) from, for example, Advantest, Teradyne, LTX-Credence, and National Instruments. Other types of ATE may also be useful.

The various modules are configured to test and analyze a DUT 129. For example, a DUT 129 is provided with test signals from the test module 103 and scanned with a laser beam by the scanning microscope module 101. The laser beam serves to perturb or stimulate the DUT 129 for testing as well as capture the DUT's image pixel-by-pixel. The image of the DUT 129 may be displayed on the display 121 for user inspection. The DUT 129 is mounted onto the test stage 117. For example, the test stage 117 supports the DUT 129 for testing. In one embodiment, the DUT 129 is an IC. The DUT 129 may be an individual IC. For example, the DUT 129 may be a die which has been singulated from a wafer with a plurality of ICs by dicing the wafer. Providing unsingulated dies for testing on the test stage may also be useful. The IC includes a plurality of metallization layers formed over the substrate or wafer for interconnecting circuit components, such as transistors, capacitors and resistors. The side of the IC which has the metallization layers is referred to as the "frontside" while the opposite side of the IC is referred to as the "backside". The IC includes a plurality of pins which allow access to the internal circuitry. For example, the pins may include power and signal pins. The power pins may include various power sources, including ground while signal pins may include input/output (I/O) pins. The signal pins may be bidirectional, unidirectional or a combination thereof. The pins may be in the form of pads for an unpackaged IC. In some cases, the pins may be contact bumps, such as a wafer level packaged IC. The pads or contact bumps are disposed on the frontside of the IC. In other cases, the IC may be a fully packaged IC. In such cases, at least a part of the package is removed for access by the scanning microscope. For example, at least the side of the package which covers the backside of the die is removed to expose the backside of the die for access by the scanning microscope. Decapping to expose the backside of the die may be achieved by laser or chemical techniques. In one embodiment, the backside of the die or IC is disposed on the surface of the test stage 117. For example, the test stage 117 includes a cavity for accessing by the laser for scanning and defect isolation.

The laser 107 generates a radiation or light beam which is directed to the backside of the die. For example, the beam is focused on the backside of the die through the test stage 117. The wavelength of the laser beam may be from about 1000-1400 nm. Other wavelengths may also be useful. The wavelength used may depend on the type or material of the substrate of the die as well as application method. For example, the wavelength should be below the bandgap of the substrate material of the die. The laser may be configured to operate as a continuous-wave laser or a pulsed laser.

The laser can be configured to operate as a pulsed laser (e.g., pulse mode). Various techniques may be employed to configure the laser to operate in the pulse mode. For example, an electro-optical modulator (EOM), a mode-locker, or a laser chopper may be employed. The frequency of the pulsed beam may be from about 1 kHz to about 500 kHz or greater. Other pulse frequencies may also be useful, for example, a pulse width of a laser beam is preferably less than 200 μs. The pulse width may be about 50 μs. Other pulse widths may also be useful. In one embodiment, the duty cycle of the pulse width is about 50%. Other duty cycles may also be useful.

The test system may be employed to identify soft or hard IC failures. In the case of identifying soft failures, the laser may be operated in either a continuous or a pulse mode. To identify hard failures, the laser may be operated in either a continuous or a pulse mode but the pulse mode is more effective. Other configurations of the laser for defect analysis may also be useful.

The incident laser beam is used to perturb the electrical characteristics of the transistors during testing. For example, the incident laser beam may serve as a heating source to heat the backside of the die to perturb the IC. The laser may be in continuous mode at a wavelength of around 1340 nm. To generate carriers, the laser may be in the continuous or pulse mode and the wavelength may be about 1064 nm. For example, the carrier generation can be caused by optical beam induced current (OBIC) effects.

The scanner 113 is employed to scan the backside of the DUT 129 with the laser beam. For example, the scanner 113 is disposed in the path of the laser beam from the laser source 107 and directs the beam to the backside of the DUT 129. The scanner 113, for example, may be controlled to scan the laser or laser beam in an x-y direction in the plane of the back of the DUT 129. Various types of scanners 113 for scanning the laser may be used. For example, the scanner 113 may be a step (non-continuous) or raster (continuous) scanner. The scanner 113, for example, scans the complete backside of the IC pixel-by-pixel. The scanner may include an output position signal which enables determination of the position of the laser beam on the backside of the die or DUT 129.

In one embodiment, the focusing unit 115, which is disposed in the beam path between the scanner 113 and test stage 117, focuses the laser beam from the scanner 113 to the backside of the IC. The focusing unit 115, for example, may be an optical column. For example, the focusing unit may include an objective lens for focusing the beam onto the backside of the IC. The lens may be an air gap or immersion lens. Other type of lenses or focusing units may also be useful. For example, the focusing unit may include curved mirrors. The focusing unit focuses the beam having a predetermined spot size. The spot size, for example, may be about 150-200 nm. Other spot sizes may also be useful. The spot size, for example, depends on the focal length of the lens of the focusing unit. The focal length of the lens can be selected depending on a desired resolution limit for the measurements.

The laser is also used to obtain a light image of the portion of the DUT or IC 129 on which the beam is focused. The light image is obtained from the reflected laser beam. For example, the reflected laser beam from the backside of the DUT 129 is sampled to obtain the image. The reflected laser beam is directed to the photodetector 109 via the beam splitter 111, which is located between the laser 107 and scanner 113. The photodetector 109 detects the reflected beam and generates a detector output signal of the reflected image. For example, the photodetector 109 detects the intensity of the reflected beam and generates a detector output signal.

The image processor 119 processes the detector output signal and generates an image of the portion of the DUT 129 sampled. The image, for example, is a reflected laser image of a pixel of the DUT 129 sampled. The location of the pixel may be determined by the location output signal from the scanner 113. The image may be displayed on the display 121. For example, as each pixel of the DUT 129 is scanned, the image may be displayed on the display 121 in real time. The image may be stored in memory. For example, the reflected laser image may be stored in memory of the image processor 119. The image may be stored in other storage locations. For example, the image may be stored in a server.

A reflected laser image of the DUT 129 may be obtained by scanning the whole DUT 129 with the laser beam. For example, scanning the DUT 129 pixel-by-pixel with the laser beam may be employed to generate a complete image of the DUT 129. In one embodiment, prior to commencing the testing, a complete image of the DUT 129 is obtained.

The test module 103 includes a reference failure log unit 123. The reference failure log unit 123 contains prior failure data of interest. The prior failure data of interest, for example, are obtained from a sort test of failed ICs and logging the failing compare vectors. Other techniques for obtaining prior failures or failing compare vectors of interest may also be useful. In one embodiment, the failing compare vectors are test vectors of interest from the sort test. As shown in FIG. 1, the tester unit 125 receives a test pattern 131 for testing the DUT 129. The test pattern 131, for example, is 3D matrix of test vectors corresponding to specific pin names of the IC and cycle numbers. For example, the test vectors may be pointers to bias or a waveform table. The test vectors may be input or outputs. In the case of inputs, they serve as driving signals. In the case of outputs, also called compare test vectors, they serve as expected signals which are compared with actual outputs from the DUT 129 corresponding to the cycle. The rising edge of the tester's clock signal may serve as a reference when input vectors are applied or when output vectors are compared. Typically, one vector or pin is tested per clock cycle. Testing more than one vector per clock cycle may also be useful. Typically, there is more than one pin under test in a clock cycle. Testing, for example, is performed while an image of the IC is being obtained from an initial scan. The synchronous or simultaneous scanning of the laser and test run is illustrated in FIG. 1 by way of directional line 130 connecting tester 125 and scanner 113.

The probe stack 127 is mounted onto the DUT 129. For example, the probe stack 127 includes electrical connections connected to pads or contacts of the IC. This enables the tester unit 125 to communicate with the IC. For example, the tester unit 125 provides a test pattern to the IC for testing as well as reads the outputs from the IC for comparison with expected values via the probe stack 127. Within a test cycle, the laser beam scans the backside of the DUT 129 to perturb the IC one test location (pixel location) at a time until the whole DUT 129 is tested. Testing at each location may be referred to as a complete test run of all the test cycles or test sequence. At each location or test run, the tester tests the IC with the test pattern. The result of the test pattern (e.g., measured or output test vector) is compared with the expected values of the test pattern to determine whether the output test vector is a failed test vector. For example, failed test vectors are output test vectors which do not match the expected values. The analysis module 105 includes a first profiler unit 133, second profiler unit 135, cross-correlation function module 137 and image processing unit 139. The first profiler 133 can be implemented either using hardware or software methods. The first profiler is configured to generate a 3D profile from the reference failure log 123 of the defective or bad device. The failing details on a bad or defective device represent the reference failing signature.

Figure 2:
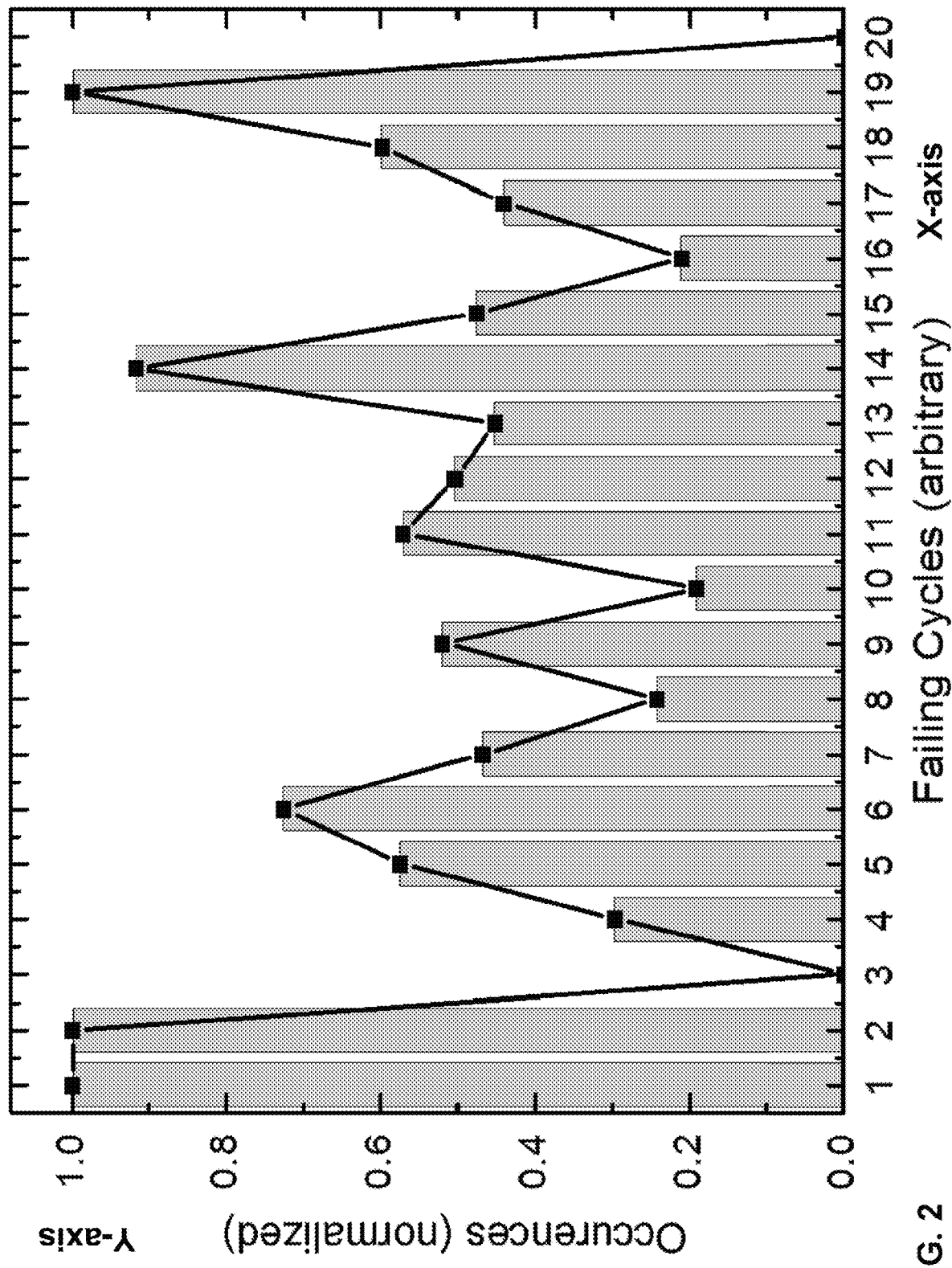
FIG. 2 is a graphical illustration of a reference failing signature (two-dimensional based on one fail pin), in accordance with an exemplary embodiment.

As shown in FIG. 2, a graphical representation of a number of occurrences (Y-axis) at different failing cycles (X-axis) of a reference fail signature is illustrated. In this embodiment, there is 1 failing pin with 20 failing cycles (X-axis) and the occurrences per cycle are registered and normalized. This forms the reference profile. During EeLADA evaluation on a DUT 129 (i.e., good die), as the laser rasters the region of interest on the DUT, a laser-stimulated profile (not shown for illustrative convenience) is generated for each pixel. The cross-correlation function module 137 then performs pixel-by-pixel comparisons of failing signatures between reference and different pixels as stimulated on the DUT. The cross-correlation function module 137 generates a signal image 141 based on the pixel-by-pixel comparison. The signal image 141 is created by the cross-correlation function module 137 based on the level of correlation. A threshold on the correlation level determines the final signal image that suggests the localized signals.

In an alternative embodiment, the 3D profile can be generated by plotting out a current profile of an entire test run. A DUT can have at least one power supply. When the laser rasters pixel-to-pixel, at each pixel, there is a complete test run on the test pattern, as discussed above. Therefore, at each pixel, the current values of the power supplies can be extracted at each cycle. When a device is powered up without a test pattern run, the current is stable at a DC value. When a test pattern is run, however, the current will fluctuate. The current fluctuation provides a profile comparison.

Figure 3:
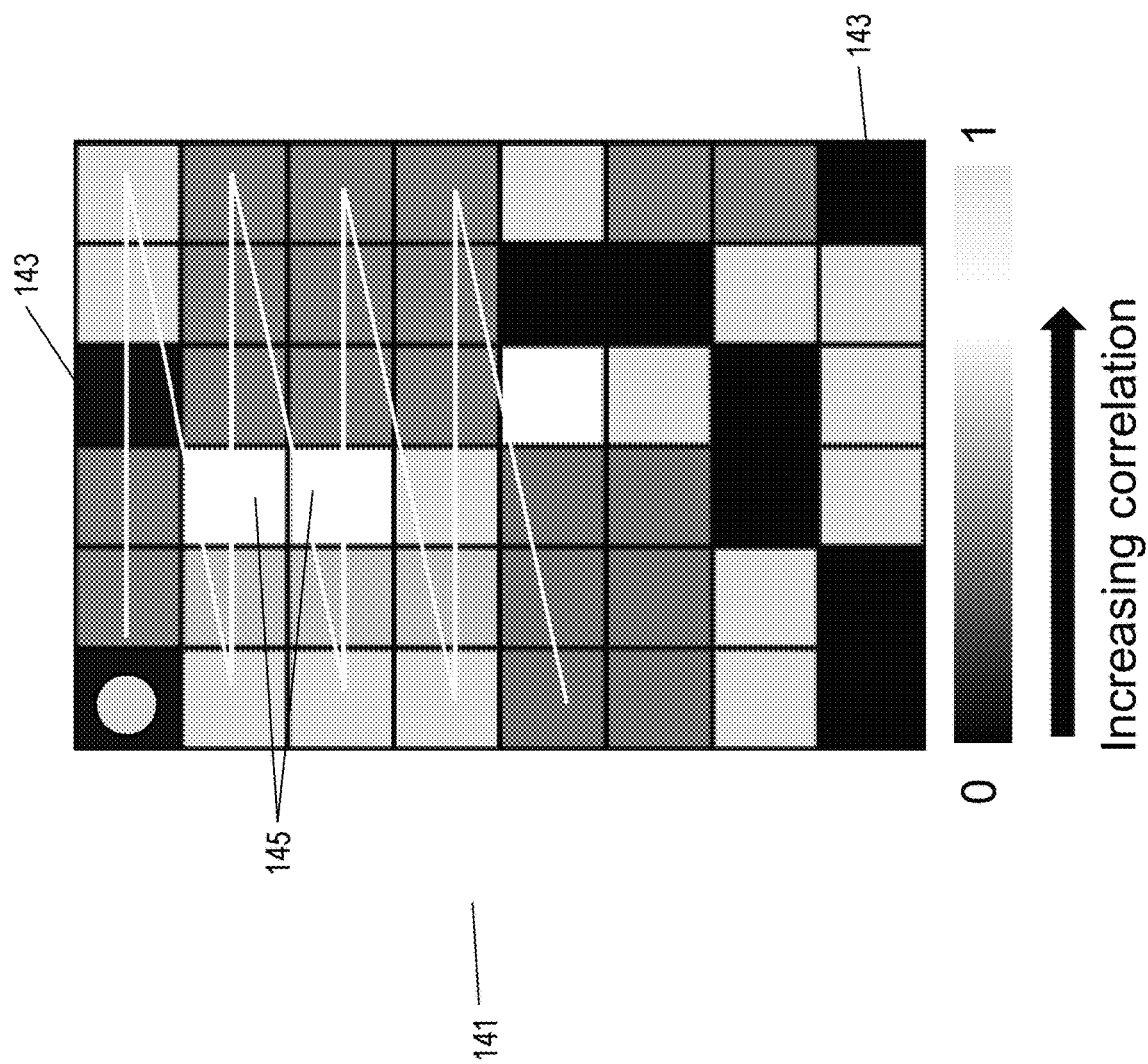
FIG. 3 illustrates an example of a technical signal image, in accordance with an exemplary embodiment.

FIG. 3 represents an example of a signal image 141 with correlation represented by way of the brightness of the pixels in grey scale. Pixel blocks 143 represents a correlation near 0 and pixel blocks 145 represents a correlation near 1. The remaining pixel blocks represent varying correlations between 0 and 1. The bright pixel blocks 145 on technical image 141 represent a match between the reference failing profile to each stimulated event.

Figure 4:
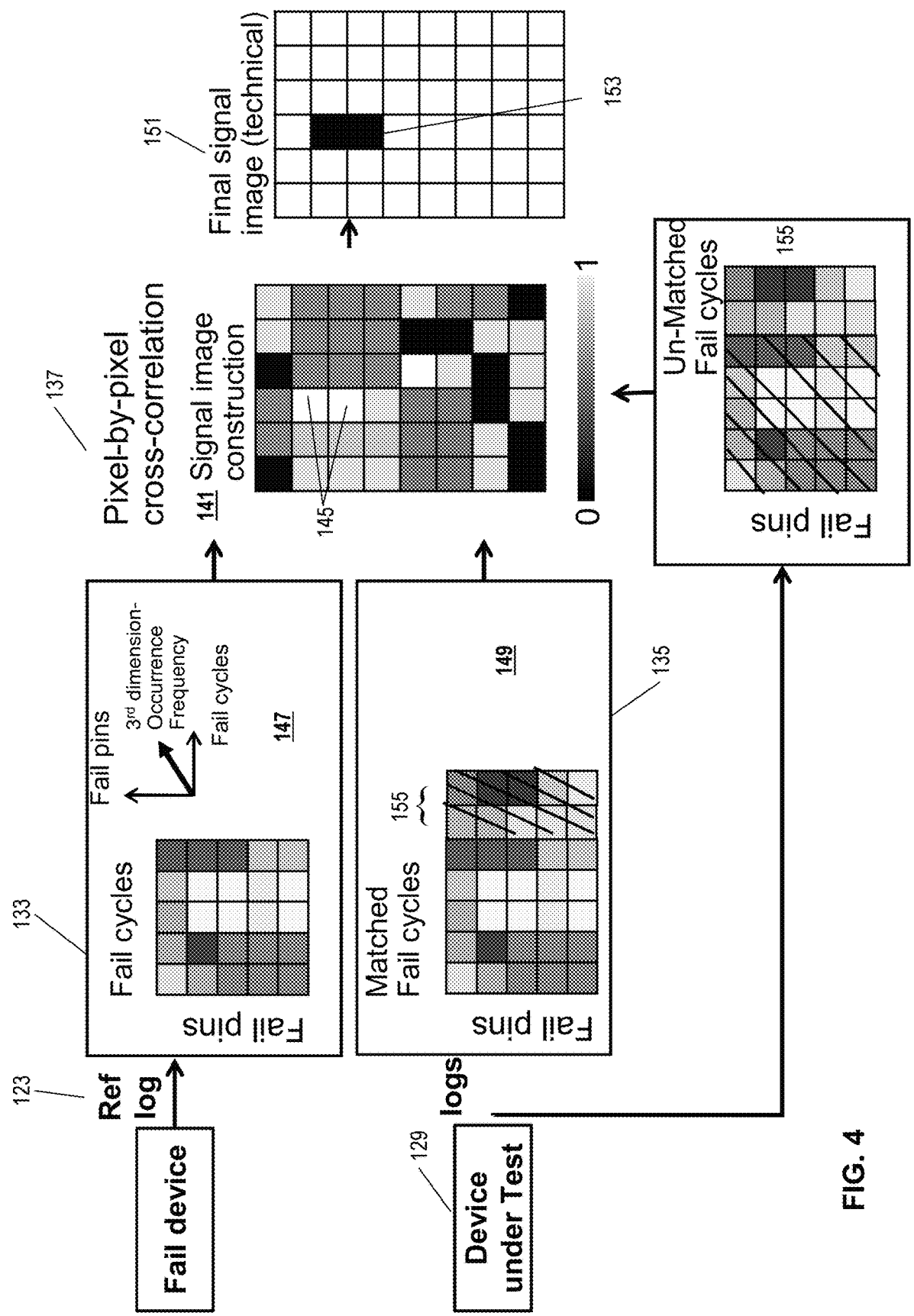
FIG. 4 illustrates an example of the analysis module of the test system of FIG. 1.

FIG. 4 further illustrates the analysis module 105 of test system of FIG. 1. As discussed previously, the first profiler 133 receive reference failure log 123 from the bad or defective device. The first profiler creates a 3D profile 147 of the reference failure log 123. The x-axis represents fail cycles, the y-axis represents fail pins and the z-axis represents occurrence frequency or cycle repeats. The second profiler 135 creates a 3D profile 149 from the DUT 129. The 3D profile 149 is a profile of each pixel of a ROI of the DUT stimulated EeLADA evaluation on a DUT 129. The number of profiles is equivalent to the total number of pixels in the ROI frame.

A pixel-by-pixel cross-correlation is performed by the cross-correlation module 137 to generate the signal image 141. As discussed previously, signal image 141 depicts a correlation by way of the brightness of the pixels. Pixel blocks 143 represents a correlation near 0 and pixel blocks 145 represents a correlation near 1. The bright pixel blocks 145 on technical image 141 represent a match between the reference failing profile to each stimulated event.

A final signal technical image or defect isolation signal image 151 is generated by the image processing unit 139. Pixel blocks 153 in the final signal technical image or defect isolation signal image 151 represent bit cell level failure in the DUT 129. Additional comparisons to unmatched fail cycles 155 can be performed to further enhance the precision of the defect isolation.

Figure 5:
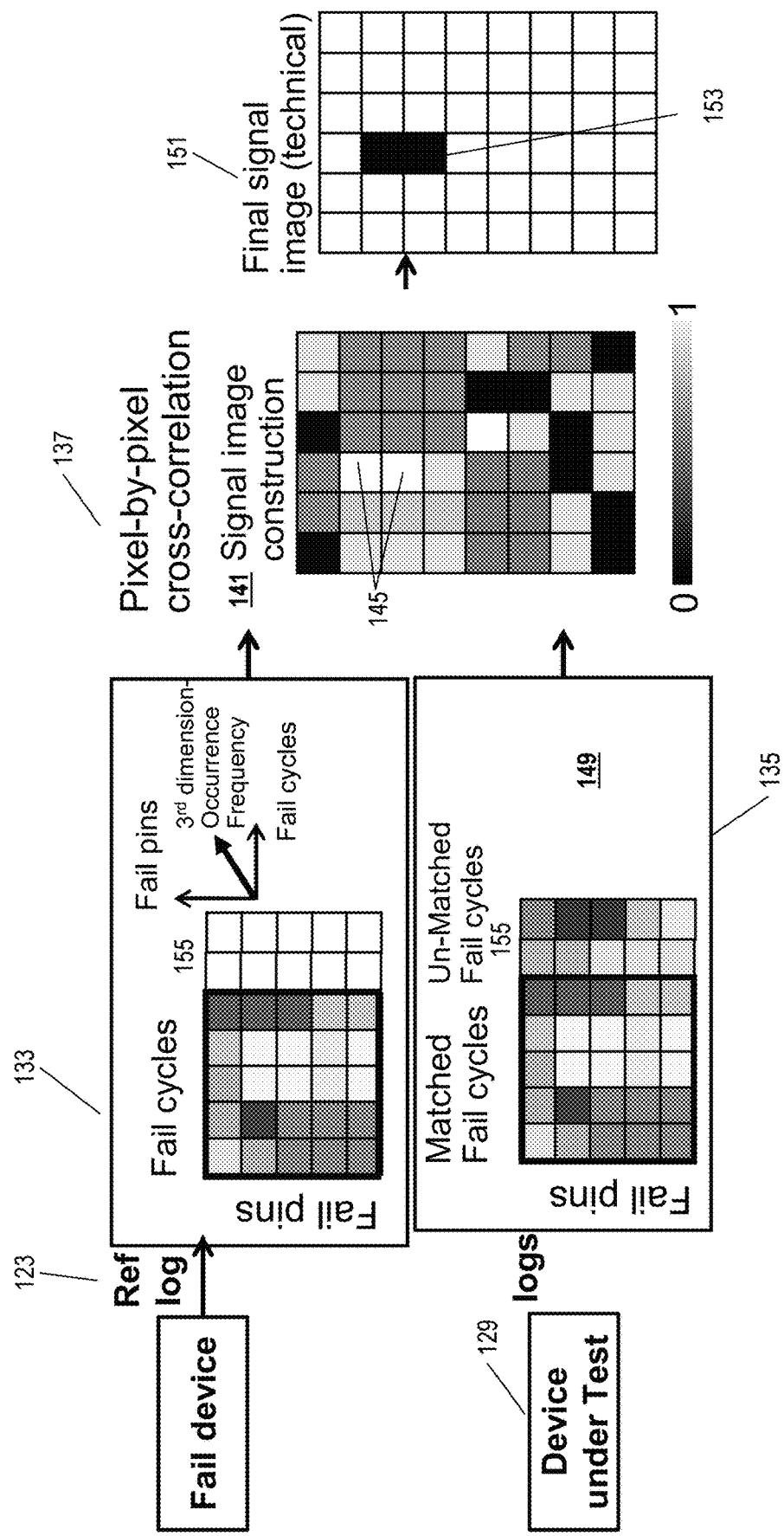
FIG. 5 illustrates another example of the analysis module of test system of FIG. 1.

FIG. 5 further illustrates another example of the analysis module 105 of test system of FIG. 1. The difference between the embodiments of FIG. 4 and FIG. 5 concerns the processing of the un-matched fail cycles 155 to the reference. For example, the laser-stimulated profile 149 may comprise fail cycles that are not present in the reference profile 147. The present embodiment includes these un-matched cycles as the profile for cross-correlation. The presence of these un-matched cycles in the cross-correlation module affects the level of correlation significantly and improves the quality signal images 141 and 151 in some cases. It should be highlighted the un-matched events may refer to un-matched fail pin information in addition to fail cycles.

FIGS. 6A through 6D represent experimental test images following a programmed defect in a DUT. In the experimental test, one or more programmed defects is created on a good die using 1340 nm continuous wave (cw) laser and solid immersion lens (SIL). In this example, the black spot 157 in the reflected laser optical image, as shown in FIG. 6A, indicates the location of a single defect. EeLADA is performed on the DUT and the results are presented in a signal technical image or defect isolation signal image of FIG. 6B. By overlaying the optical image and signal technical image, the known defect location 157 is compared to the EeLADA signal. As shown in the enlarged image of FIG. 6D, the accuracy of the defect localization is about 3 µm.

The embodiments of the present disclosure can achieve several technical effects, such as improved diagnostic resolution of embedded memory on the failing bit-cell. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including embedded memory and application-specific integrated circuits.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A system comprising:
automated testing equipment (ATE) interfaced with a wafer probe including a diagnostic laser for stimulating a device under test (DUT) with the diagnostic laser at a region of interest (ROI), wherein the ATE is configured to simultaneously perform a test run at a test location of the DUT with a test pattern during stimulation of the DUT;
storage for storing failing compare vectors of a reference failure log of a defective device;
a first profile module configured to generate a first three-dimensional (3D) profile from each pixel of a reference image of the defective device;
a second profile module configured to generate a second 3D profile from each pixel of the ROI of the DUT; and
a cross-correlation module configured to execute a pixel-by-pixel cross-correlation from the first and second 3D profiles and generate an intensity map corresponding to a level of correlation between the DUT and defective device.

2. The system of claim 1, wherein:
the first 3D profile comprises fail pins, fail cycles and cycle repeats based upon memory or application-specific integrated circuits test vectors on the defective device, and the fail cycles are represented on an X-axis of the 3D profile, fail pins represented by on a Y-axis, and cycle repeats on a Z-axis, and
wherein the second 3D profile comprises a total number of pixels in the ROI which corresponds to a number of profiles.

3. The system of claim 1, wherein the first 3D profile comprise a profile generated by plotting of a current profile of an entire test run of the defective device.

4. The system of claim 1, wherein the test run comprises a memory or application-specific integrated circuit test run at bit-cell or intended resolution.

5. The system of claim 1, wherein the intensity map comprises a grey scale map.

6. The system of claim 1, wherein the diagnostic laser is interfaced with a wafer probe.

7. The system of claim 1, wherein a defect location is determined by way of a higher level of correlation of the DUT and defective device.

8. The system of claim 7, wherein the higher level of correlation is represented by brighter pixel regions indicating a memory or specific defect in the DUT.

9. The system of claim 1, wherein the DUT comprises a semiconductor wafer including embedded memory or application-specific integrated circuit.

10. A system comprising:
automated testing equipment (ATE) interfaced with a wafer probe including a diagnostic laser for stimulating a device under test (DUT) with the diagnostic laser at a region of interest (ROI), wherein the ATE is configured to simultaneously perform a test run at a test location of the DUT with a test pattern during stimulation of the DUT;

storage for storing failing compare vectors of a reference failure log of a defective device;

a first profile module configured to generate a first three-dimensional (3D) profile from each pixel of a reference image of the defective device;

a second profile module configured to generate a second 3D profile from each pixel of the ROI of the DUT; and a cross-correlation module configured to execute a pixel-by-pixel cross-correlation from the first and second 3D profiles and generate an intensity map corresponding to a level of correlation between the DUT and defective device, wherein the first 3D profile comprise a profile generated by plotting of a current profile of the test run of the defective device.

11. The system of claim 10, wherein:

the first 3D profile comprises fail pins, fail cycles and cycle repeats based upon memory or application-specific integrated circuits test vectors on the defective device, and the fail cycles are represented on an X-axis of the 3D profile, fail pins represented by on a Y-axis, and cycle repeats on a Z-axis.

12. The system of claim 11, wherein the second 3D profile comprises a total number of pixels in the ROI which corresponds to a number of profiles.

13. The system of claim 10, wherein the test run comprises a memory or application-specific integrated circuit test run at bit-cell.

14. The system of claim 10, wherein the test run comprises a memory or application-specific integrated circuit test run at intended resolution.

15. The system of claim 10, wherein the diagnostic laser is interfaced with a wafer probe.

16. The system of claim 10, wherein a defect location is determined by way of a higher level of correlation of the DUT and defective device.

17. The system of claim 10, wherein the DUT comprises a semiconductor wafer including embedded memory.

18. The system of claim 10, wherein the DUT comprises a semiconductor wafer including an application-specific integrated circuit.

* * * * *